United States Patent [19]

Mayne-Banton et al.

[11] 4,417,948
[45] Nov. 29, 1983

[54] SELF DEVELOPING, PHOTOETCHING OF POLYESTERS BY FAR UV RADIATION

[75] Inventors: Veronica I. Mayne-Banton; Rangaswamy Srinivasan, both of Ossining, N.Y.

[73] Assignee: International Business Machines Corporation, Armonk, N.Y.

[21] Appl. No.: 396,985

[22] Filed: Jul. 9, 1982

[51] Int. Cl.$^3$ .................... B44C 1/22; C03C 15/00; C03C 25/06
[52] U.S. Cl. .................... 156/643; 156/654; 156/668; 219/121 LM; 250/492.1; 427/53.1; 427/54.1
[58] Field of Search .............. 156/643, 646, 654, 655, 156/668; 219/121 LH, 121 LJ, 121 LM; 250/492 R; 427/53.1, 54.1; 430/296, 363

[56] References Cited

U.S. PATENT DOCUMENTS

| | | | |
|---|---|---|---|
| 3,549,733 | 12/1970 | Caddell | 264/25 |
| 3,617,702 | 11/1971 | Flournoy | 219/384 |
| 3,626,143 | 12/1971 | Fry | 219/121 LJ |
| 3,920,951 | 11/1975 | Chovan et al. | 219/121 L |
| 4,247,496 | 1/1981 | Kawakami et al. | 264/22 |

FOREIGN PATENT DOCUMENTS 2115548 10/1972 Fed. Rep. of Germany.

OTHER PUBLICATIONS

Journal of Applied Polymer Science, vol. 16, pp. 175-189, (1972), Photochemical Degradation of Poly-(Ethylene Terephthalate, I, Irradiation Experiments With The Xenon and Carbon Arc by M. Day et al.
Journal of Applied Polymer Science, vol. 16, pp. 191-202, (1972), Photochemical Degradation of Poly-(Ethylene Terephthalate), II, Effect of Wavelength and Environment on the Decomposition Process by M. Day.
Journal of Applied Polymer Science, vol. 16, pp. 203-215, (1972), Photochemical Degradation of Poly-(Ethylene Terephthalate), III, Determination of Decomposition Products and Reaction Mechanism by M. Day et al.
Journal of Applied Polymer Science, vol. 17, pp. 1895-1907, (1973), Photochemical Degradation of Poly(Ethylene Terephthalate), IV, Surface Changes by P. Blais et al.
Journal of Polymer Science: Part A-1, vol. 5, 481-501, (1967), Photolysis of Poly(Ethylene Terephthalate Late by F. B. Marcotte et al.

*Primary Examiner*—William A. Powell
*Attorney, Agent, or Firm*—Jackson E. Stanland

[57] ABSTRACT

A technique is described for photoetching polyesters, such as polyethylene teraphthalate (PET), efficiently, and without causing degradation or heating of the bulk of the PET material. At least about 1000Å of the polyester are removed by application of ultraviolet radiation having wavelengths less than 220 nm. To enhance the process, irradiation can occur in the presence of oxygen or air.

23 Claims, 2 Drawing Figures

SELF DEVELOPING, PHOTOETCHING OF POLYESTERS BY FAR UV RADIATION

TECHNICAL FIELD

This invention relates to a technique for photoetching polyesters, such as polyethylene teraphthalate (PET) by far uv radiation of wavelengths less than 220 nm. The polyester is removed in a controlled manner without subsequent processing, and without heating and degradation of the bulk of the material.

BACKGROUND ART

Mylar (a trademark of E. I. DuPont deNemours) is a well known material, and will be referred to hereafter as PET. It is a polyester which has ester groups only in the backbone of the hydrocarbon chain comprising its polymer. Commercially, it is a very useful material that is used as a medium for audio and video tapes, and for many aspects of semiconductor circuitry, including circuit boards. It is characterized by high strength and excellent chemical stability.

Although PET is a very useful material, it is difficult to provide intricate patterns in it, because a chemical which dissolves it in a controlled way does not exist. Patterning of PET is desirable for many reasons, such as the fabrication of circuits and to prevent PET films from clinging excessively to tape heads in tape applications. Previously, some patterning of PET was achieved using a long wavelength laser to modify the surface of the PET films by intense local heating. Such a technique is described in U.S. Pat. Nos. 3,549,733; 3,617,702; 3,920,951; and in German Pat. No. 2,115,548. In all of these patents, wavelengths in excess of about 250 nm were used. The mechanism to modify the PET films depended upon localized thermal effects from the heat of the laser beam.

It is also desirable to modify the surface of PET in order to make it more wettable. This promotes adhesion of PET to other films, such as metal films or other polymer films. In order to modify the surface of the PET films to promote wettability, an electric discharge has been passed across the surface of the film while a reactive inorganic vapor was present, as described in U.S. Pat. No. 3,255,099. The electric discharge had no effect unless the vapor was also present.

Photochemical decomposition of PET films involves the use of laser beams to cause photochemical reactions in the PET film. The following references are examples of this:

1. M. Day et al., J. Appl. Polymer Sci. 16, (1972), a series of three articles I–III, beginning on pages 175, 191, and 203, and a fourth article IV by M. Day et al. appearing in this journal, Vol. 17, pp. 1895–1907 (1973).
2. F. B. Marcotte et al., J. Polymer Sci. 55, 477 (1961).
3. F. B. Marcotte et al., J. Polymer Sci. Part A-1, Vol. 5, 481–501 (1967).

The Marcotte et al. references describe the photolysis of PET with ultraviolet radiation having a wavelength greater than 250 nm. The purpose of that laboratory investigation was to study the weathering of this polymer. As noted from those studies, this ultraviolet irradiation produced degradation of the polymer, the most effective wavelength causing degradation being 3130 A. During photolysis, the gaseous products formed are CO and $CO_2$. Additionally, the polymer molecules are split and cross-linked and different radicals are formed. On page 498 of Reference 3, the authors note that the quantum yields for CO and $CO_2$ formation are similar for light having wavelengths 2537 and 3130 A. Additionally, it is stated that the gross chemical effects are similar for these different wavelengths, although they occur in a much thinner layer for 2537 A light than for 3130 A light.

The effect of long wavelength radiation in the weakening of the PET polymer is described by D. J. Carlsson and D. M. Wiles in the text "Ultraviolet Light Induced Reactions in Polymers," Ed. S. S. Labana, ACS Symposium, Serial No. 25, page 321 (1976).

The series of four articles I–IV listed in Reference 1 (M. Day et al.) describes an extensive laboratory analysis of the photochemical degradation of PET during ultraviolet irradiation having wavelengths 220–420 nm. In these references, it is noted that molecular chain breaking and degradation occcur with ultraviolet radiation of any wavelength, and that the longer wavelengths are absorbed throughout the bulk of the polymer, while the shorter wavelengths are absorbed much more readily by the polymer. The main volatile products are CO and $CO_2$, and appear to be produced more readily when the photolysis occurs in the presence of oxygen.

Article IV of this series describes the surface changes which occurred during the ultraviolet irradiation of the PET polymer. On page 1902 of this article, it states that the textural and physical damages at the surface of the polymer were minimal, even after prolonged uv exposure, although some volatilization appeared to take place from the irradiated regions (page 1904). However, progressive deterioration of the bulk of the polymer occurred, as noted on page 1906.

Thus, although Articles I–IV describe in detail many of the types of chemical reactions which occur during uv irradiation of PET, no drastic surface changes were noted. As noted in these references, all wavelengths of ultraviolet radiation cause chain-breaking and degradation of the polymer. However, as applicants have discovered, the character of the photochemistry occurring during ultraviolet irradiation changes remarkably when the wavelengths of radiation are less than 220 nm (although Article II lists the wavelength range as 200–400 nm, this is a loose designation, the lowest wavelength used being 220 nm as determined by the filter used in the optical system of that reference). There appears to be a threshold at a wavelength of less than 220 nm where the molecular chain-breaking process becomes much more efficient and in which the bulk of the polymer does not become degraded. At wavelengths less than 220 nm, surface changes rapidly occur and uv irradiation at wavelengths less than 220 nm causes photoetching of the surface of the PET. This photoetching occurs rapidly and can be used to produce patterns in the PET, and to completely remove PET from the irradiated regions in a short amount of time. It is this much more greatly efficient photochemical process that underlies applicants' invention.

U.S. Pat. No. 4,247,496 describes a method for treating a thin surface layer of a plastic material, such as PET. In this patent the plastic material is subject to an ultraviolet light treatment, after which it is stretched. The ultraviolet light has a wavelength ranging from 180 to 400 nm, and is emitted by sources such as mercury lamps, fluorescent lamps, xenon lamps, and carbon-arc lamps.

In the patent described in the previous paragraph, the phenomonon which occurs is one which is described in the aforementioned Reference IV to Blais, Day and Wiles. The ultraviolet light treatment causes cracking in a surface layer (50-100 Å) of the plastic. These cracks make stretching easier, and leave a surface which contains widened cracks therein.

In U.S. Pat. No. 4,247,496 no photoetching is involved, because it is important that only a thin surface layer be affected. U.S. Pat. No. 4,247,496 does not recognize that selected wavelengths of ultraviolet light can be used to efficiently photoetch PET. In that patent, a broad wavelength range of ultraviolet light is used to affect only a thin surface layer of the PET in order to enhance stretching of the PET.

In contrast with this, the invention of the present application is directed to photoetching of PET by a range of ultraviolet radiation having wavelengths less than 220 nm. What is desired is effective photoetching of PET and not merely a surface treatment. In this invention, specified far uv is used to etch PET without affecting the bulk of the material and without causing undue heating. In fact, several of the lamps suitable in the practice of the invention described in U.S. Pat. No. 4,247,496 cannot be used in the present invention. These unsuitable uv sources include high pressure mercury lamps, xenon lamps, and carbon-arc lamps. In further contrast with that patent, the present invention relies on the use of far uv radiation to photoetch through a substantial portion of the PET, wherein low power can be used to effectively photoetch. For example, 1,000 Å of the PET can be removed per ArF excimer laser pulse in 12 nsec., where the pulse has a power of 150 mJ.

It is recognized that any uv irradiation of a plastic material will cause degradation of the material after a long time. For example, the reference to Blais et al describes degradation effects which occur over very prolonged exposure (for example, thousands of hours). In contrast with this, the present invention is directed to efficient photoetching of PET where the active wavelengths for this process must be <220 nm.

It would be advantageous to have a suitable process for photoetching polyesters such as PET without adversely weathering the material. Accordingly, it is a primary object of the present invention to provide a technique for the photochemical decomposition of polyesters including PET to a depth at least about 1,000 Å to bring about changes in its properties, without adverse weathering effects.

It is another object of the present invention to provide a technique for photoetching the surface of polyesters including PET without the use of localized heating.

It is another object of the present invention to provide a technique for photochemical decomposition of PET, without degrading and weathering the PET.

It is another object of the present invention to provide a self developing technique for photoetching polyesters, such as PET.

It is a further object of this invention to provide a technique for selective photoetching the surface of PET without the requirement for any liquid solvents.

It is another object of the present invention to provide a technique for rapid etching of polyesters without relying on thermal effects.

It is a still further object of this invention to provide a photoetching treatment for photochemically decomposing a layer of PET without modifying the bulk of the material.

It is a still further object of this invention to provide a photochemical surface treatment of PET which has reaction rates many orders of magnitude greater than prior photochemical techniques.

It is another object of this invention to provide a self developing photoetching technique that can be used to provide precise patterns of any depth in polyesters, such as PET.

DISCLOSURE OF INVENTION

In its broadest sense, this invention is the photoetching of polyesters, such as PET, with wavelengths of <220 nm to affect a layer of the polyester at least about 1,000 Å thick. This far ultraviolet (uv) radiation can be provided from a continuous source, such as a low pressure Hg resonance lamp specifically designed to give these wavelengths, or by a pulsed source, such as an ArF excimer laser.

As an example, the PET can be either a film located on a substrate, or bulk material, such as a strip of PET. Exposure to far uv radiation in the wavelength range <220 nm affects a layer of the PET, penetrating a fraction of a micron into the PET. This is a very high efficiency process for bond breaking in the polymer chain of the PET, and any type of source or system providing radiation of wavelength <220 nm can be used. Exposure of the PET can be done in vacuum, in a nitrogen atmosphere, or in air, etc., but the photochemical treatment occurs at higher rates in an atmosphere containing oxygen. The presence of oxygen sustains a reaction in which the hydrocarbon chain of the PET is broken by the incident uv radiation.

Selected patterns can be produced in the PET by use of a mask, or by moving the uv radiation beam across the PET.

These and other objects, features, and advantages will be apparent from the following more particular description of the preferred embodiments.

BEST MODE FOR CARRYING OUT THE INVENTION

Figure 1:
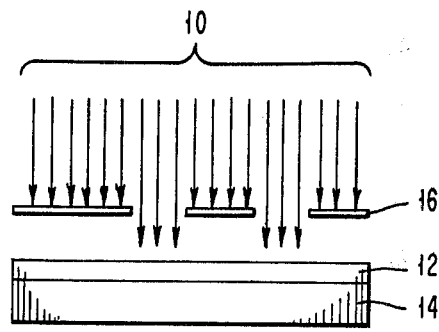
FIG. 1 schematically illustrates the incidence of far uv radiation ($\lambda<220$ nm) on a polyester film in order to photoetch it.

In the practice of this invention, for uv radiation of wavelengths less than 220 nm is incident on a film or bulk polyester (for example, PET) and photochemically etches a layer of the material. Although electromagnetic radiation of wavelengths between 200 and 150 nm is often referred to as "far ultraviolet radiation," as can be seen by referring to a text by J. G. Calvert and J. N. Pitts, Jr., entitled "Photochemistry," published by John Wiley and Sons, Inc., New York, 1966, page 18, this definition is arbitrary. In the condensed phase, organic photochemical processes which are characteristic of the far uv are limited at the high end of energy to 180 nm by experimental difficulties and, at the low end, extend to 210–220 nm, although a gradual diminution in the quantum yields of the processes is observed. For the purpose of this invention, "far uv" refers to all wavelengths less than 220 nm, and therefore includes wavelengths shorter than 150 nm.

Two light sources are commercially available for providing radiation of wavelengths (λ) less than 220 nm. These are the low pressure mercury resonance lamp (λ=185 nm) designed for this wavelength range, and the argon fluoride laser (λ=193 nm). This mercury resonance lamp is a continuous source which operates at a minimum of cost per photon of far uv light. However, it suffers from the low surface luminosity of the discharge lamp. For example, a lamp of 39 watts input is nearly one meter long. This source is well suited for irradiation of large areas to low net reaction. A bank of 6 lamps can be used to irradiate an area of 9,000 cm$^2$ with 4.2 milliwatts/cm$^2$ of 185 nm radiation.

The argon fluoride laser is designed for pulsed operation and, typically, 300 mJ pulses (1.5 cm$^2$ area) are available at a repetition rate of 10/sec. The intensity of the pulses is invariant over many thousands of pulses. This laser can be coupled to a standard camera with appropriate optics to provide an apparatus for the exposure of wafers or semiconductor devices coated with PET films to far uv radiation projected through a mask.

In the practice of this invention, any source or system providing a wavelength of <220 nm is suitable for irradiation of the surface of the PET. Any short wavelength radiation source which will produce this high yield photoetch effect on PET and which has a high efficiency for hydrocarbon chain bond breaking and a low penetration (within a fraction of a micron) into PET is suitable.

FAR UV PHOTOCHEMISTRY OF PET

Far uv radiation at wavelengths <220 nm is intensely absorbed by PET, and leads to high yield dissociative processes. In addition to the high energy of a photon in this wavelength range, which exceeds the strength of any bond found in PET, the photochemistry is affected by three considerations which control the system. These are the following:

1. nearly all organic groups in PET absorb radiation of these wavelengths intensely, having typical extinction coefficients of approximately $0.5-1.0 \times 10^4$ liter/mole cm., calculated on a per absorbing group basis.
2. The radiative lifetimes of the excited states are exceedingly short, typically 0.1 nsec. Since fluorescence is rarely observed, lifetimes for bond breaking must be of the order of 1-10 picoseconds.
3. Quantum yields for bond breaking are of the order of 0.1-1.0, which is 10-50 fold larger than those in the mid uv (220-300 nm) and near uv (greater than 300 nm) regions.

The intense absorption of the organic groups in PET determines that 95% of the radiation in the wavelength range <220 nm is absorbed in a depth of much less than 1 micrometer of the PET. Since nearly every photon is effective in breaking a bond, the polymer is split into smaller units. These fragments will continue to absorb the radiation and break into smaller units until, ultimately, the small molecules that are the end products vaporize and carry away the excess energy of the photon as translational, vibrational, and rotational energy. For this, it is required that:

1. All of the chemistry occur only in the optical path, and that all of the material in the optical path be eventually removed;
2. very little heating of the substrate or bulk of the film occurs. The PET film can be said to ablate under the influence of light;
3. the photochemistry be limited at any instant to the depth to which the incident radiation is absorbed. Thus, in a PET strip which is 10 fold thicker than the depth of penetration of the uv radiation, the bulk of the material is chemically unchanged.

In this photochemical process, the PET surface is etched in a controlled manner without the need for subsequent processing. The reaction is due to the high absorption cross section of the PET films, which results in the energy being trapped in the first 2000 Å of the material, the high efficiency for bond breaking at these photon energies, and the formation of numerous small fragment molecules which promotes their volatilization. This process is observed in a vacuum or in a gaseous atmosphere (nitrogen, oxygen, etc.), but is accelerated approximately 10 fold in the presence of air.

The photochemical process is initiated by the short wavelength (<220 nm) uv radiation, which breaks the long hydrocarbon chains in PET into shorter chains. The process is initiated by the radiation, but is continued by oxygen, which seals the ends of the shorter chains so that there is a minimal probability for the shorter chains to rejoin in a longer chain. Thus, the presence of oxygen enhances the chainbreaking process so that smaller and smaller by-products are produced, which can be released as volatile products.

It is important to note that the photochemical process in the present invention depends only upon the presence of light of a wavelength <220 nm, and does not require the presence of oxygen for the photochemical reaction to occur. This is in contrast with the incidence of uv radiation of longer wavelengths, where oxygen is required for etching. For example, reference is made to page 336 of the aforementioned text by Carlsson and Wiles. At these longer wavelengths, there is no photoetching surface effect even after a long time. The photons go into the bulk of the material and cause weathering, i.e., aging. Even if volatile products are produced by this long wavelength radiation, these products are trapped in the bulk of the material and cannot escape.

In the practice of this invention, the only critical parameter is the wavelength of the uv radiation. The power and power density of the incident radiation are not critical, and a laser is not required. Both pulse and continuous wave radiation can be used, and the final depth of etching of the PET depends upon the time of exposure to the uv radiation, at constant intensity.

APPARATUS FOR SURFACE TREATMENT OF PET

FIG. 1 conceptually illustrates the process whereby PET can be patterned or have a layer of its entire surface affected. Ultraviolet radiation of wavelengths <220 nm, represented by the arrows 10, impinges upon a layer 12 of PET on a substrate 14. A mask 16 is shown in this drawing to illustrate that selective portions of the surface of the PET layer can be exposed to the radiation 10. Of course, the entire surface of the layer 12 could be exposed.

The layer of PET need not be supported by a substrate 14, and can be bulk material. Substrate 14 can be a semiconductor wafer on which the PET film 12 is formed, or any other substrate. Also, the time of exposure can be sufficiently long that the PET 12 is completely etched away.

Figure 2:
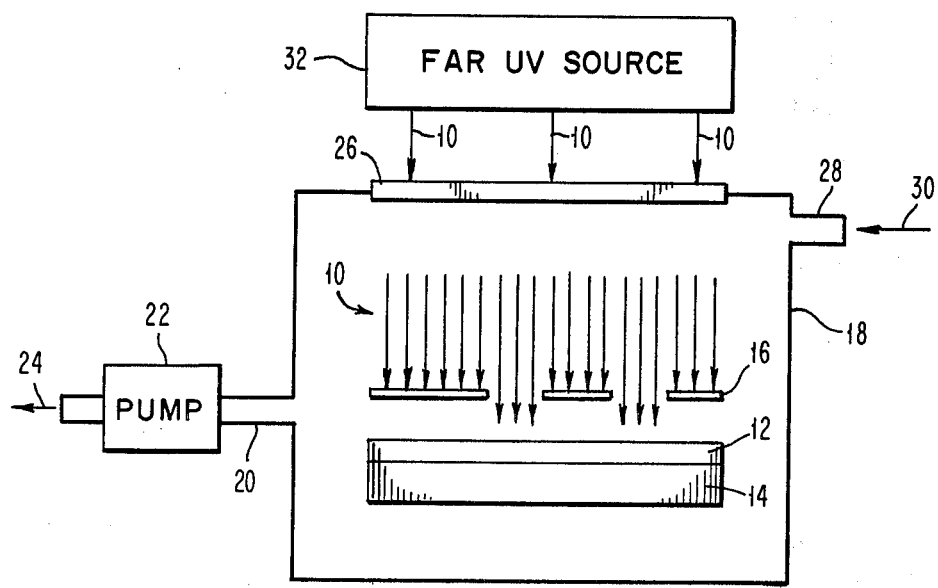
FIG. 2 is a schematic illustration of an apparatus which can be used to practice the present invention, in which the polyester is exposed to far uv radiation (<20 nm) in a chamber into which various gasses, including air, can be introduced, or in which a vacuum can be created.

FIG. 2 shows an apparatus in which the PET 12 and the substrate 14 are located in a chamber 18. This could be, for example, a vacuum chamber having an output port 20 to which a pump 22 is attached. The interior of chamber 18 can be evacuated to a desired pressure by the pump 22, and the pump can also be used to remove the volatile products formed during the photochemical etching of the PET 12. Arrow 24 indicates the removal of these residual by-products.

Chamber 18 has a window 26 through which ultraviolet radiation of proper wavelength can pass, as indicated by the arrows 10. The mask is again designated 16.

Chamber 18 is also provided with an input port 28, which preferably includes a valve for the introduction of selected gasses, such as air, oxygen, nitrogen etc. These input gasses are represented by the arrow 30.

In operation, the PET material is located in chamber 18 and appropriately masked if only selected portions of the surface of PET 12 are to be exposed. The far uv source 32 is then turned on to provide uv radiation 10 of wavelengths <220 nm through window 26. This will cause photoetching of the surface of layer 12, as explained previously.

EXAMPLES

In a first example, films of PET were irradiated with 193 nm radiation produced with a Lambda Physik EMG 500 pulsed laser filled with argon and fluorine. The laser had an output of 13 mW/cm$^2$ at 1 Hz. An iris was used to select the central 0.5 cm circle of the beam, which was collimated through a quartz spherical lens. Care was taken to place the irradiated films off-focus. The incident energy was 50-100 mJ/cm$^2$/pulse, and the pulse duration was 12 nsec. Each such pulse would photoetch the PET to a depth of about 1000 Å.

In a second example, the PET was irradiated at 185 nm with a CW mercury resonance lamp, which produced 1.6 mW/cm$^2$ at the irradiated surface. For both the first and second examples, films of PET of 250 micrometers and 1.5 micrometers thickness were used, as obtained.

In both of these examples, the progressive loss of material was in a geometry that was defined by the light beam, no development being necessary to achieve this result. The results at 193 nm and at 185 nm were the same, when corrected for the wide difference in the light intensity. The process was approximately 10-fold slower in a vacuum, or in a nitrogen atmosphere, than in air. This was explained previously as being due to the face that oxygen seals that ends of the broken parts of the hydrocarbon chain, preventing their rejoining. The rate of photoetching of material was approximately 1000 Å/pulse in air, the precise rate being a function of the area of the surface which was exposed. This is a very efficient photoetching process that is photochemically very different from the effects which occur at wavelengths 220 nm and longer.

In comparing this value of the rate of etching/pulse of a given energy to conventional photolithography, it must be noted that the photochemical process described herein deals with mass transport during or immediately following the incidence of the uv radiation. In contrast with this, mass transport from the irradiated area in conventional photolithographic processes occurs predominantly during wet development.

Assuming an absorption coefficient $\epsilon$ of approximately $10^4$, and a molecular weight 248, the penetration depth for 95% absorption of the uv radiation was 0.27 micrometers. That is, the uv photons were confined to a depth of 2700 Å less for 95% absorption.

In another example, a metallized (lead) film of PET was irradiated with pulsed 193 nm light. The PET was removed to a depth of approximately 1 micrometer in the area which received the radiation, in 5 seconds. This was confirmed by tallysurf measurements in interferometry. The irradiated surface showed a fine structure which indicated that the film did not reach its softening point during irradiation. Infrared spectra of irradiated films showed no significant changes in the absorption pattern when compared to unirradiated films, but the intensity of the absorption decreased with exposure. This confirmed the thought that, while the films become thinner on irradiation, the products of the photoreaction are present at only a low level on the film itself, the major portion being lost by evaporation. This was corroborated by further experiments in which the volatile products of the photoreaction were trapped and analyzed.

In the practice of this invention, films and bulk PET materials are exposed to uv radiation of wavelengths less than 220 nm in order to photochemically etch the PET to a depth in excess of what would be termed a surface effect only. Either a mild treatment or extensive treatment (prolonged exposure) can be undertaken, in order to affect the depth of etching. If desired, the PET can be totally removed in selected areas. Any type of source or apparatus providing radiation in this wavelength range can be used, as can any type of optical system for impinging this radiation upon the PET. The PET can be of any grade, molecular weight, thickness, etc.

In the further practice of this invention, the materials which can be photoetched rapidly and efficiently by uv radiation of wavelengths <220 nm include any organic polymers which incorporate ester groups in their backbones and are made by the condensation of terephthalic acid and $\alpha$, $\omega$ dihydricalcohol of any molecular weight. The ester groups are responsible for the enhanced photosensitivity which is observed, and therefore the invention includes those polymers which incorporate ester groups in their backbones or in their side chains.

While the invention has been described with respect to preferred embodiments thereof, it will be appreciated by those of skill in the art that variations may be made without departing from the spirit and scope of the invention.

Having thus described our invention, what we claim as new and desire to secure by Letters Patent is:

1. A method for etching polyethylene teraphthalate (PET) comprising photoetching said PET to a depth of at least 1,000 Å without degradation of the bulk of the PET by irradiating said PET with uv radiation having wavelengths less than 220 nm.

2. The method of claim 1, where said uv radiation has a wavelength of 193 nm.

3. The method of claim 1, where said uv radiation has a wavelength of 185 nm.

4. The method of claim 1, where said radiation is produced by an ArF laser.

5. The method of claim 1, where said uv irradiation occurs in the presence of a gas selected from the group consisting of air, oxygen, nitrogen, and mixtures thereof.

6. The method of claim 1, where said uv irradiation occurs in a vacuum.

7. The method of claim 1, where said uv irradiation continues until said PET is completely photoetched in the area of irradiation by said uv radiation.

8. The method of claim 1, where said uv irradiation is applied in selected areas of said PET.

9. The method of claim 1, where said uv irradiation occurs in an atmosphere containing oxygen.

10. The method of claim 1, where said PET is a film located on a substrate.

11. A method for photoetching the surface of polyethylene teraphthalate (PET) including the steps of:

breaking the long hydrocarbon chains in a surface layer of said PET into shorter chains by incident uv radiation of wavelengths less than 220 nm to photochemically produce small molecules which are volatile, said surface layer having a depth of at least about 1,000 Å but being much less than 1 micrometer in thickness, said beaking occurring along the path of said radiation in said PET and being limited at any instant to the depth to which said radiation is absorbed, said depth being between about 1,000 Å and 1 micrometer, sealing the ends of said shorter chains to reduce the probability of said shorter chains recombining to form long hydrocarbon chains.

12. The method of claim 11, where said sealing is accomplished in the presence of oxygen.

13. The method of claim 11, where said PET surface is irradiated with said radiation in selected regions thereof.

14. The method of claim 11, where said radiation is applied as pulses.

15. The method of claim 11, where said irradiation is applied continuously.

16. A method for photochemically etching polyethylene teraphthalate (PET) without heating the bulk of the PET, comprising the step of impinging radiation on the surface of said PET, said radiation having a wavelength <220 nm such that substantially all of said radiation is intensely absorbed by said PET in a surface layer having a depth between about 1,000 Å and less than 1 micron, said radiation photochemically reacting with said PET to a depth less than 1 micron, all of said photochemical reaction occurring only in the path of said radiation in said PET and producing volatile molecules which vaporize and are thereby removed from said surface layer in those regions struck by said radiation.

17. The method of claim 16, where said PET is located in a gaseous environment, said environment including gasses selected from the group consisting of oxygen, nitrogen, air, and mixtures thereof.

18. The method of claim 16, where said PET is located in a vacuum environment.

19. The method of claim 16, where said radiation impinges upon said PET in selected areas thereof.

20. A method for photoetching an organic polymer having ester groups therein to a depth of at least 1,000 Å without degradation of the bulk of the polymer, using the steps of:

irradiating the surface of said organic polymer with uv radiation of wavelength <220 nm to produce volatile products from a surface layer at least 1,000 Å deep, without heating of the bulk of said polymer, and continuing said irradiation until said photoetching is completed to a desired depth.

21. The method of claim 20, where said irradiation occurs in the presence of a gas selected from the group consisting of air, oxygen, nitrogen, and mixtures thereof.

22. A method for controllably photoetching an organic polymer having ester groups therein to a depth of at least 1,000 Å without degradation of the bulk of the polymer, including the steps of:

irradiating the surface of said polymer with uv radiation having a wavelength <220 nm to remove a surface layer thereof to a depth of at least 1,000 Å, said organic polymer incorporating an ester group in its backbone and being made by the condensation of terephthalic acid and $\alpha, \omega$ dihydric alcohol of any molecular weight, and continuing said irradiation until said photoetching is completed to a desired depth.

23. The method of claim 22, where said irradiation occurs in the presence of a gas selected from the group consisting of air, oxygen, nitrogen, and mixtures thereof.

* * * * *